(12) United States Patent
Zhang et al.

(10) Patent No.: US 8,912,617 B2
(45) Date of Patent: Dec. 16, 2014

(54) METHOD FOR MAKING SEMICONDUCTOR LIGHT DETECTION DEVICES

(75) Inventors: Lan Zhang, Palo Alto, CA (US);
Ewelina N. Lucow, Mountain View, CA (US); Onur Fidaner, Sunnyvale, CA (US); Michael W. Wiemer, Campbell, CA (US)

(73) Assignee: Solar Junction Corporation, San Jose, CA (US)

( * ) Notice: Subject to any disclaimer, the term of this patent is extended or adjusted under 35 U.S.C. 154(b) by 0 days.

(21) Appl. No.: 13/283,379

(22) Filed: Oct. 27, 2011

(65) Prior Publication Data

US 2013/0105930 A1   May 2, 2013

(51) Int. Cl.
*H01L 31/0216*  (2014.01)
*H01L 31/0224*  (2006.01)
*H01L 31/0687*  (2012.01)

(52) U.S. Cl.
CPC .. *H01L 31/02168* (2013.01); *H01L 31/022425* (2013.01); *H01L 31/0687* (2013.01); *Y02E 10/544* (2013.01); *Y02E 10/547* (2013.01); *Y02E 10/52* (2013.01)
USPC .................................. 257/437; 257/E31.119

(58) Field of Classification Search
USPC ............ 257/E27.123–E27.126, 437, E31.119
See application file for complete search history.

(56) References Cited

U.S. PATENT DOCUMENTS

| | | | |
|---|---|---|---|
| 4,838,952 A | 6/1989 | Dill et al. | |
| 8,115,097 B2 | 2/2012 | Guha et al. | |
| 2008/0276981 A1 | 11/2008 | Kinoshita et al. | |
| 2011/0303281 A1* | 12/2011 | Kodama | 136/256 |
| 2011/0308599 A1* | 12/2011 | Stangl | 136/256 |
| 2012/0019596 A1* | 1/2012 | Lee et al. | 347/44 |

OTHER PUBLICATIONS

Chen et al., "Cu-plated through-wafer vias for AlGan/GaN high electron mobility transistors on Si", Journal of Vacuum Science and Technology B, vol. 27, Issue 5, 2009, 5 pages.
Danzilio, "Overview of EMCORE's Multijunction Solar Cell Technology and High Volume Manufacturing Capabilities", The International Conference on Compound Semiconductor Manufacturing Industry, May 2007, 4 pages.
Van Kerschaver et al., "Back-contact Solar Cells: A review", Progress in Photovolataics: Research and Applications, vol. 14, 2006, pp. 107-123.
Zaknoune et al., "Nonselective wet chemical etching of GaAs and AlGaInP for device application", J. Vac. Sci. Technol. B 16, 223, 1998, 4 pages.

* cited by examiner

*Primary Examiner* — Tony Tran
(74) *Attorney, Agent, or Firm* — William R. Lambert; Kenneth Allen; Kilpatrick Townsend & Stockton LLP

(57) ABSTRACT

A semiconductor light detection device fabrication technique is provided in which the cap etch and anti-reflection coating steps are performed in a single, self-aligned lithography module.

13 Claims, 9 Drawing Sheets

METHOD FOR MAKING SEMICONDUCTOR LIGHT DETECTION DEVICES

BACKGROUND OF THE INVENTION

This invention relates to a method for making semiconductor light detection devices such as solar cells and photodetectors and products made according to the method. The invention is particularly useful for high-power solar cells and photodetectors. More particularly the invention relates to a method of patterning anti-reflection coatings on solar cells, particularly multi junction solar cells, to accommodate epitaxial contact regions with minimum loss.

Conventional light detection devices have features that reduce the efficiency of optical (e.g. solar) to electrical energy conversion. For example, a portion of the absorbed optical (solar) energy cannot be collected at the electrodes as electrical power and has to be dissipated as heat. For high-power devices, the dissipated heat may result in substantially increased temperature, thereby further reducing the performance of the device. It is desirable to improve efficiency in semiconductor light detection devices and, in particular, solar cell devices.

Conventional multi junction solar cells have been widely used for terrestrial and space applications. Multi junction solar cells, typically considered as high-powered solar cells, comprise multiple diodes (aka junctions) in series connection, realized by growing thin regions of epitaxy in stacks on semiconductor substrates. Each junction in a stack is optimized for absorbing a different portion of the solar spectrum, thereby improving efficiency of solar energy conversion.

Typical fabrication steps in state-of-the-art multi junction solar cell processing have been described by D. Danzilio et al. "Overview of EMCORE's Multi junction Solar Cell Technology and High Volume Manufacturing Capabilities", CS MANTECH Conference, May 14-17, 2007, Austin, Tex., USA and are summarized below. It should be noted that the list below gives merely the basic steps and that additional process steps may be employed.

1. Epitaxial Growth
2. Mesa Lithography and Etch
3. Metal Grid Lithography Deposition and Lift-off
4. Cap Lithography and Etch
5. Anti-reflection Coating, Deposition, Pattern and Etch
6. Backside Metal Deposition and Anneal
7. Dicing In the prior art, conventional semiconductor processing techniques are used in the above steps. The process steps between epitaxial growth and dicing (steps 2 through 6) have conventionally not been required to follow a particular order. The Cap Lithography and Etch step together with the Anti-reflection Coating steps of the prior art are relevant to the invention and will be discussed herein for background purposes.

Cap Etch

Typically, the top region in the epitaxial stack (usually called the cap region or cap layer) is a semiconductor region that is highly doped to promote good metal-semiconductor electrical contacts with low contact resistance. The cap region may comprise multiple heterogeneous epitaxial regions. In solar cell manufacturing, the cap region is patterned into a grid of lines (a cap grid) so that in a subsequent metallization step a corresponding metal grid is deposited on top of the cap grid. The patterning and the subsequent cap etch are achieved by conventional semiconductor processing techniques.

FIG. 1 A shows the cross-section schematic of a typical (prior art) semiconductor-based light detection device, represented by a multi junction solar cell 100. The entire device is depicted, but the method according to the invention is performed only on the top and affects only the cap region 3 and the front surface field (FSF) region 4, which are the top regions of a multi-junction epitaxy grown on a semiconductor substrate 5. The solar cell 100 shown in FIG. 1A consists of three sub-cells (junctions) 106-108 that are connected through tunnel junctions 167 and 178. It is to be understood that FIG. 1A is merely an example of a typical multi junction solar cell and that such solar cells may comprise any number of sub-cells. FIG. 1B is a simplified schematic of a typical (prior art) multi junction solar cell which only shows the top epitaxial regions relevant to this patent.

Referring to FIG. 1A, the FSF region 4 is the window region that faces the sun after cap etch. Underneath the FSF region 4 is the emitter region 102 of the top p-n junction 106 that forms a diode. Similar junctions 107 and 108 are disposed below the top p-n junction thus forming a multi junction cell. The FSF region 4 has an important function for the performance in the device. For example, since multi junction solar cells are minority carrier-type devices, the minority carriers generated through photoabsorption in the emitter region 102 of the top junction 106 must diffuse into the depletion region 103 in order to be collected at the base 104. Having a low surface recombination velocity in the emitter region 102 increases the number of minority carriers that make it to the depletion region 103. The function of the FSF region 4 is thus to improve the quality of passivation on the surface region 102 and to reduce the surface recombination velocity by reflecting back the minority carriers that diffuse away from the depletion region 103.

The FSF region 4 is a thin (usually 10 nm to 50 nm) epitaxial region. In addition to improving the collection of the carriers generated in the emitter region 102, the FSF region 4 is usually an absorbing region. The photogenerated minority carriers in the FSF 4 diffuse through the emitter region 102 to the depletion region 103 of the top junction 106 to be collected. Consequently, protection of the top surface 14 of the FSF 4 is important for improving the collection of the minority carriers in the FSF 4.

During conventional manufacturing, the FSF region 4 becomes exposed to a variety of conditions in the process flow subsequent to the cap etch step. These conditions may include, but are not limited to:

Exposure to air and water in a variety of temperature conditions that may occur during process, which can result in oxidation of the FSF region surface 14.

Exposure to metal particles penetrating on the FSF region surface 14.

Contact with various chemicals and photoresist at the FSF region surface 14, potentially leaving residues and damaging the surface.

Partial or full etch of the FSF region 4 due to use of various chemicals in the process steps that follow the cap etch.

Such adverse conditions reduce the performance of the solar cell substantially. For example in process flows in which the metal grid 2 is deposited while the FSF region 4 is exposed, residual silver or other metals may impinge on, contaminate and permeate into the FSF region 4 and propagate into the inner epitaxial regions 45 thereby reducing efficiency and impacting the performance of solar cells. Consequently, in high-power semiconductor light detection structures, there is a strong need to protect the FSF region surface 14 once it is exposed.

In addition to defects and residues resulting from subsequent photolithography steps, problems are caused by grid metal that comes into direct contact with the FSF region 4. For example, in process flows in which the metal grid 2 is deposited while the FSF 4 is exposed, silver/metal particles may find their way into the exposed FSF and propagate into the p-n junction regions underneath the FSF, rendering the solar cell useless. Moreover, as depicted in FIG. 2, misalignment of the metal grid pattern 2 with respect to the cap grid pattern 3 due to lithographical inaccuracy can result in direct contact between the metal 2 and the FSF 4. The portion of the metal 6 on the FSF 4 may result in metal spikes into the junctions during high temperature process steps, resulting in non-operational devices. Such metal related problems are typically observed as shunted current-voltage (IV) characteristics. FIG. 3 (prior art) compares the IV characteristics of two different solar cells. IV curve 9 is from a high-performance solar cell with no alignment problems, and IV curve 8 shows a shunted current-voltage characteristics resulting from misalignment of the metal grid. In the prior art, to prevent the metal grid from making contact with the FSF, the cap grid width is typically chosen to be larger than the metal grid width for lithographical misalignment tolerance. A wider cap width negatively affects the performance of the solar cell by increasing the shadowing loss and reducing the current that can be extracted. Consequently there is a need to eliminate metal contact with the FSF surface without increasing the shadowing loss.

Anti-Reflection Coating

In prior art multi junction solar cell manufacturing, the cell is coated with an anti-reflection coating (ARC) 1 (FIG. 1) to reduce reflection of sunlight. ARC 1 is usually a stack of thin films of dielectrics, the refractive indices of which are chosen to minimize the reflection of sunlight over a desired wavelength range. The collective ARC 1 region is required to cover the entire surface of the semiconductor facing the sun, i.e., including the FSF. In the past the gridlines were typically also covered during ARC deposition. ARC on busbars must be opened to allow for wirebonding, however. This process step is called contact opening and is typically realized using a separate, additional photolithography step. In the prior art, the ARC deposition and patterning may be performed at different stages and hence there is no specific requirement to realize this step in a particular order within the process flow.

SUMMARY OF THE PROBLEMS WITH PRIOR ART AND POTENTIAL FOR PERFORMANCE IMPROVEMENT

The problems related to cap etching and anti-reflection coating steps of the prior art are summarized herein. Addressing the problems listed herein is necessary to make high-performance multi junction solar cells and other semiconductor light detection devices:

1. Protection of the FSF surface during subsequent process steps from contamination and oxidation.
2. Electrical isolation of the FSF from metal grids, except through highly-doped contact region.
3. Elimination of extra cap near gridlines to minimize current loss from shadowing.
4. Minimizing number of lithography steps to make the process robust and cost-effective.
5. Misalignment tolerant grid metallization.
6. Precise lithographical alignment in contact opening step following ARC deposition, so that ARC can be removed from contact pad regions.

SUMMARY

According to the invention, a method is provided for making a semiconductor light detection device in which the cap etch and anti-reflection coating steps are performed using a single, self-aligning lithography module. In particular, the steps are performed in such an order as to minimize exposure of the front surface field region to contaminants and to assure metal to cap region alignment so that the metallized contact regions on top minimally blocks incident light. Photoresist is patterned with a cap etch pattern on a provided substrate incorporating epitaxy of a semiconductor light detection device. Subsequently, the cap region is etched, and anti-reflection coating (ARC) is deposited without removing the photoresist. Lastly, the photoresist is removed, henceforth lifting-off the ARC over the defined cap regions. The invention is particularly applicable to the manufacture of high-powered light detection devices such as high-efficiency solar cells.

In the following description reference is made to the accompanying drawings which form a part hereof wherein like numerals designate like parts throughout, and in which is shown by way of illustration specific embodiments in which the invention may be practiced.

DETAILED DESCRIPTION OF THE INVENTION

The main process steps according to the invention are given in FIG. 4A through FIG. 4E.

Figure 1A:
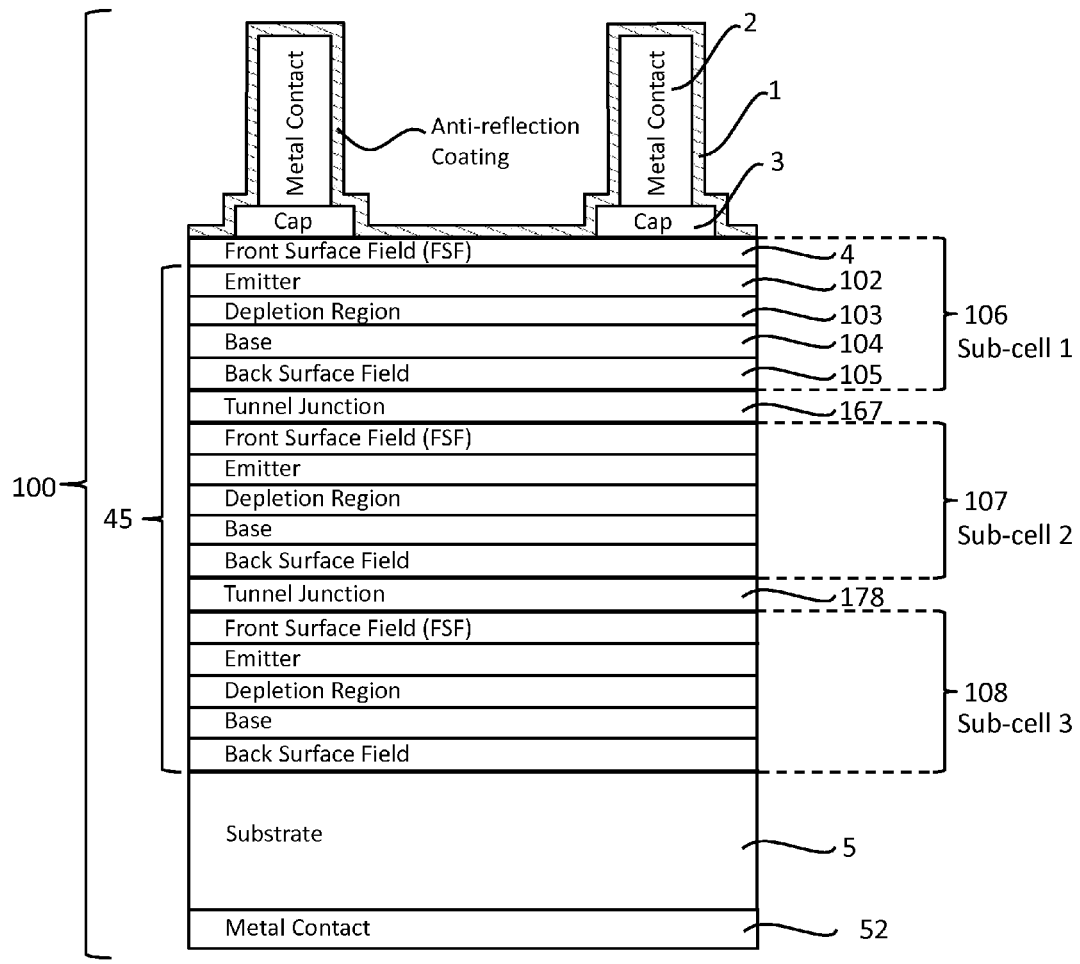
FIG. 1A is a cross-sectional diagram of a multi junction solar cell in which the invention could be used.
Figure 1B:
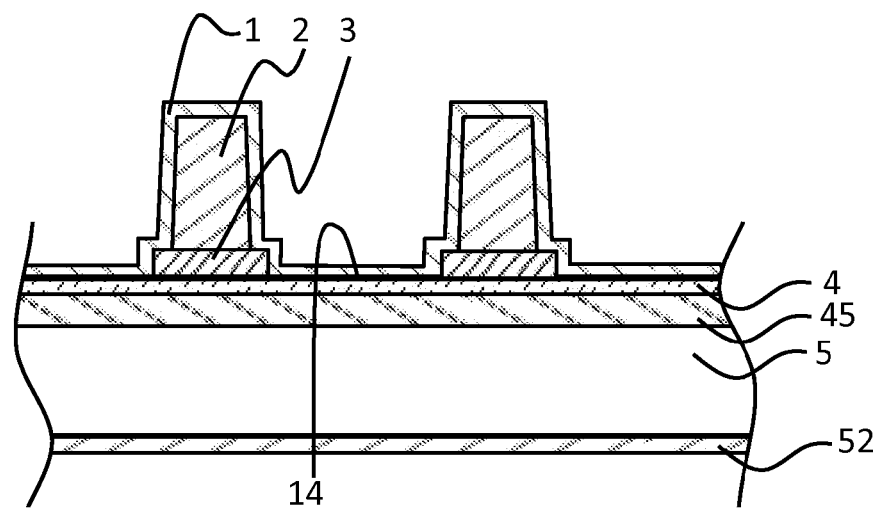
FIG. 1B is a simplified version of FIG. 1A.
Figure 2:
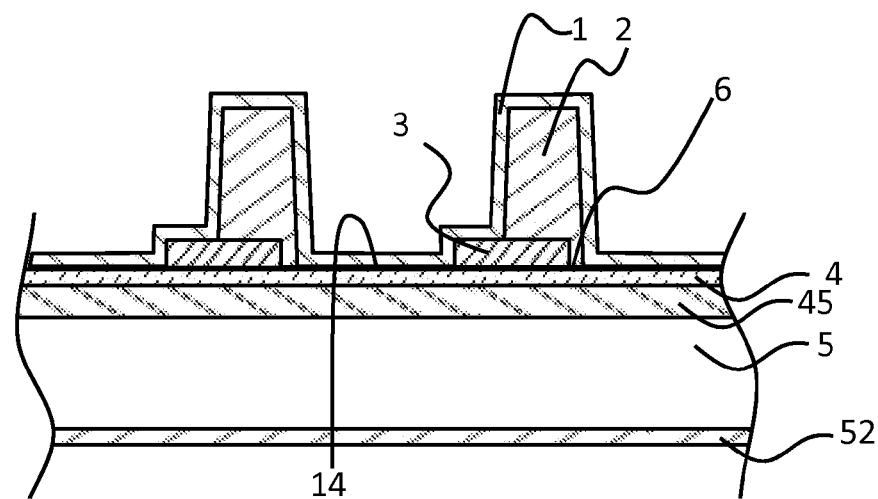
FIG. 2 is a cross-sectional diagram of a portion of a prior art cell in which the cap and metal are misaligned.
Figure 3:
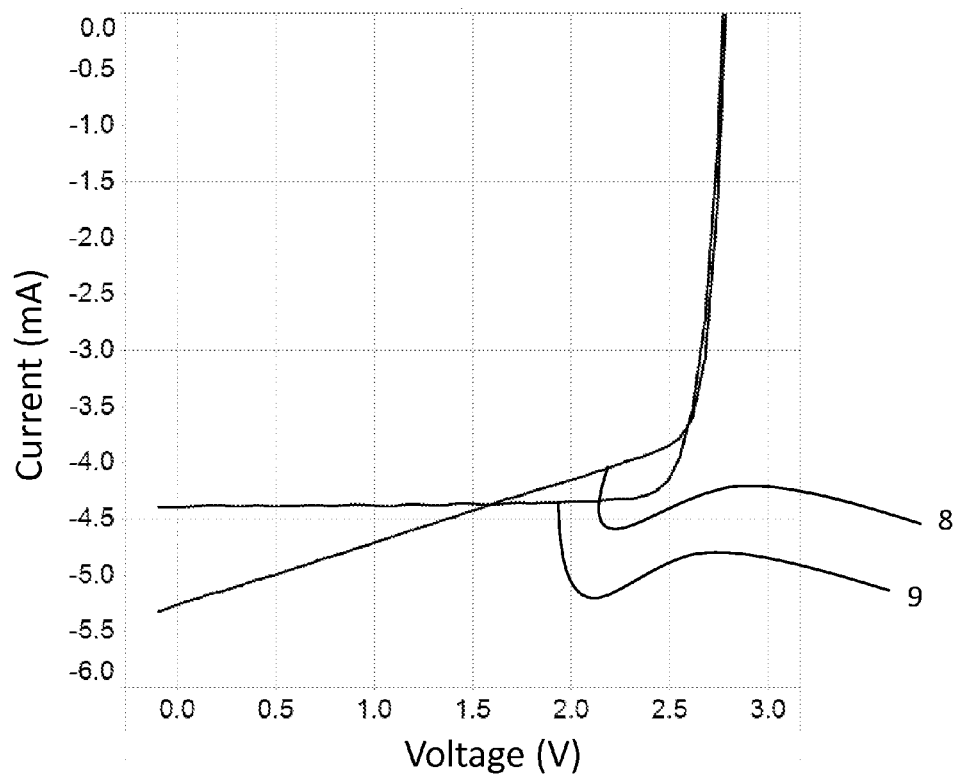
FIG. 3 is a graph of performance of a prior art solar cell in comparison with an ideal cell.
Figure 4A:
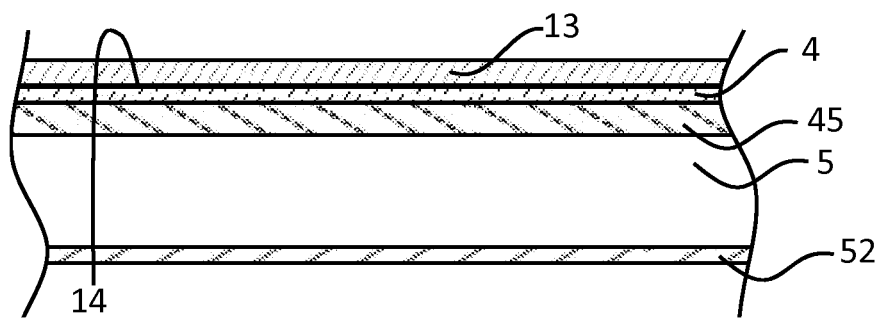
FIGS. 4A-4E illustrate the process steps according to the invention.
Figure 4B:
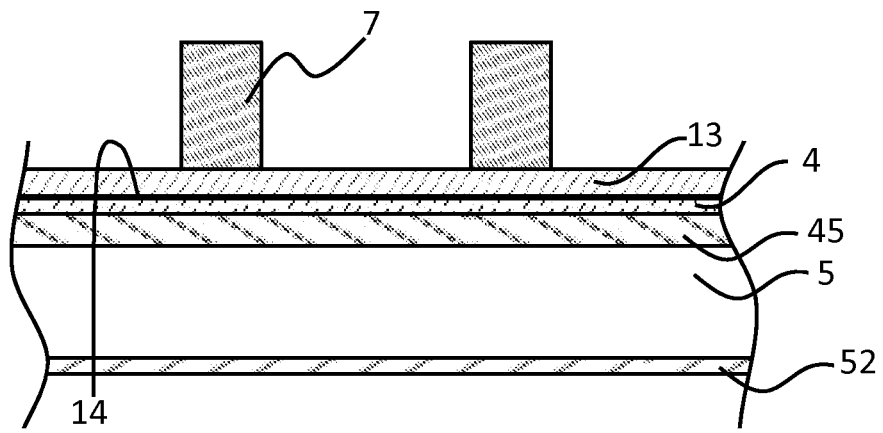
Figure 4C:
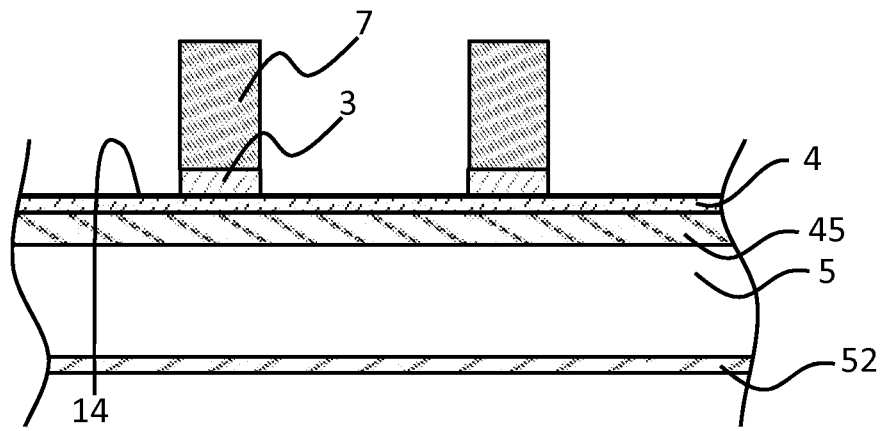
Figure 4D:
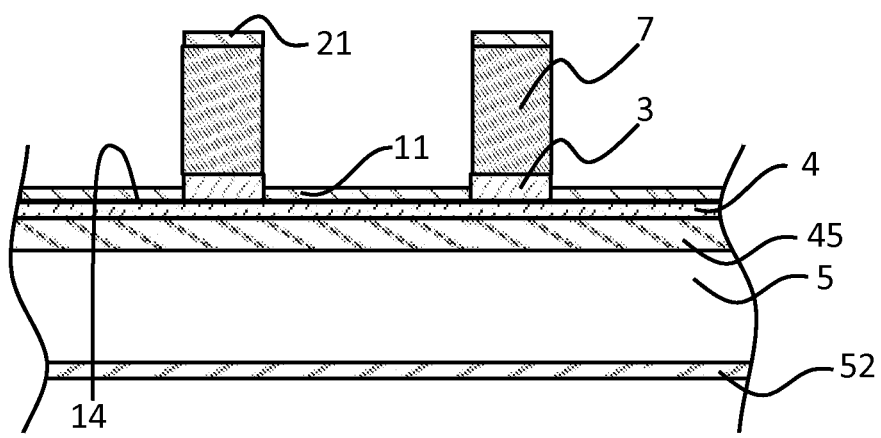
Figure 4E:
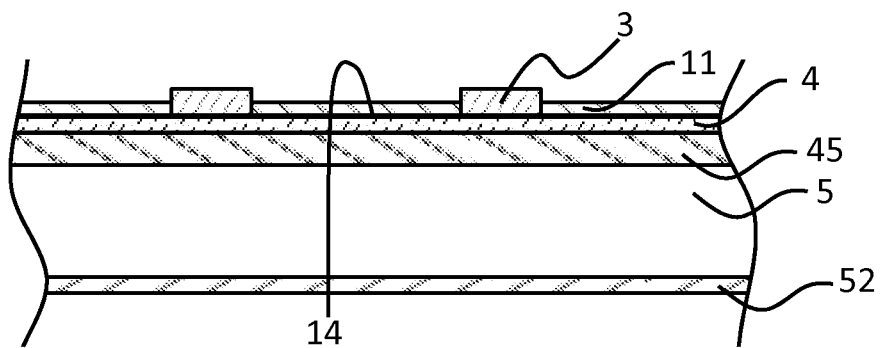

1. FIG. 4A: Provide a semiconductor substrate with epitaxial regions 45 such that the top portion is a cap region 13 and underneath is a protected and uncontaminated window (FSF) region 4.
2. FIG. 4B: Apply conventional photolithography techniques to yield cap grid structure pattern 7 in photoresist.
3. FIG. 4C: Etch the cap such that the etch stops when the FSF 4 is exposed to yield a structure that is a patterned cap 3 on FSF 4.
4. FIG. 4D: Without removing the photoresist 7, and preferably soon after the previous etch in Step 3, deposit anti-reflection coating 11 and 21.
5. FIG. 4E: Remove the photoresist 7. The anti-reflection coating on top of the resist 21 will be removed and the resulting structure will be patterned anti-reflection coating 11 completely covering the FSF surface 14 without covering the patterned cap 3.

In the present invention the order of the process steps listed above is critical. The remaining process steps, however, can be designed and executed in a variety of ways. In other words, the present invention is a "process module" of process steps that can be inserted into other process flows as necessary. The intervening steps, before the module or after the module can be conventional semiconductor processing steps. In the following list, the order of steps between the epitaxial growth and dicing steps can be changed as necessary, and other steps may be added to the flow.

Epitaxial growth
    The process module of the present invention
    Metal Grid Lithography Deposition and Lift-off
    Mesa Lithography and Etch
    Backside metal deposition and anneal
    Dicing In this process the subcells (junctions) forming the solar cell are serially connected through the epitaxy and the metal grid makes a top contact to the top junction and the bottom junction is contacted through the substrate by backside metal 52. The present invention is more generally applicable anytime contacts are made to light detection devices from the front side of the substrate, including cases where junctions in a multi junction solar cell are contacted individually to make multi-terminal solar cell devices. The process flow for such devices is generally more complicated and includes more steps. However, the process module as described by the present invention can be used to make top contacts.

The present invention solves critical problems of Prior Art as described in the background section:

1. After the cap etch and anti-reflection coating there is no chemical contact with the FSF region, such as photolithography or etching. The window region is protected from exposure to chemicals, contaminants, air, and water. Oxidation of the FSF region can be prevented during thermal cycles that may occur in multi junction solar cell fabrication.
2. The possibility of mechanical damage on the FSF region during processing is reduced.
3. Common materials used for anti-reflection coating are generally good electrical insulators as well. As an example, silicon dioxide is preferred as top region in some products. These oxides have been used in the semiconductor industry for long years as high-quality insulators.
4. In case of misalignment, the metal will sit on a high-quality dielectric material. Hence the FSF region is protected and electrically isolated from the metal grid except through the cap region. The dielectric material prevents metal spiking into the device layers in case of misalignment.
5. The window region exposed after cap etch is sealed and protected with the anti-reflection coating without any process steps in between. When metallization takes place in the subsequent steps, there is no possibility of metal particles getting on the FSF and subsequently migrating into the inner device regions.
6. As a result of this process, the ARC does not cover the metal. Hence there is no need for a separate contact opening lithography step to remove the ARC on the busbars. Contact opening is readily achieved during lift-off of patterned resist.

Variations of the Invention

The cap etching and subsequent anti reflection coating steps can be inserted at a desired point in the full process flow. In a preferred embodiment, the cap etch and subsequent anti reflection coating steps are the first steps in semiconductor processing after the epitaxial growth of the junctions. Subsequently, metal grids are patterned using lift-off. Following metallization, mesa isolation etch is done. The process is finalized with back metallization and dicing.

The self-aligned nature of the invention allows multiple configurations of the widths of the cap and the metal grid.

Figure 5:
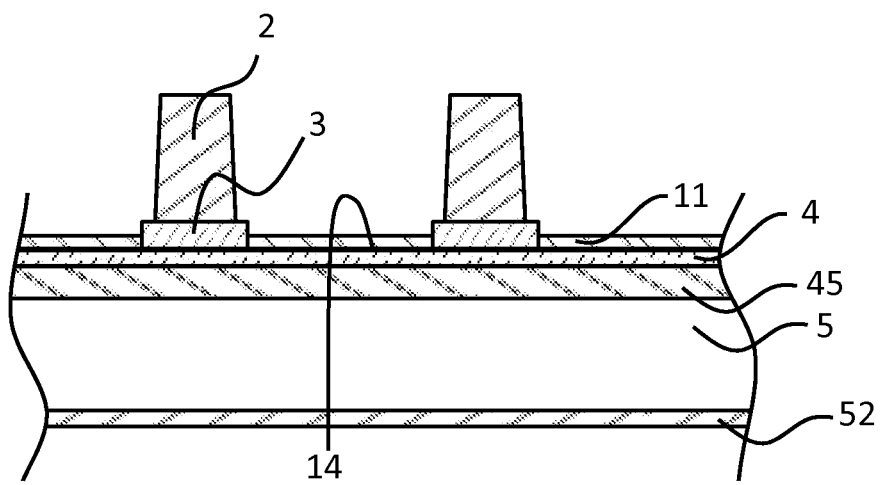
FIG. 5 is an illustration of an alternative embodiment of a structure made according to the invention.

In one embodiment, as shown in FIG. 5, the width of the cap 3 is chosen to be wider than the width of the metal grid 2. In such a case, the grid shadowing is determined by the cap width rather than the metal width. In the case of misalignments that cannot be tolerated by the wider cap, the anti-reflection coating 11 will act as an electrically isolating barrier between the metal falling outside of the cap 3 and the FSF 4.

Figure 6A:
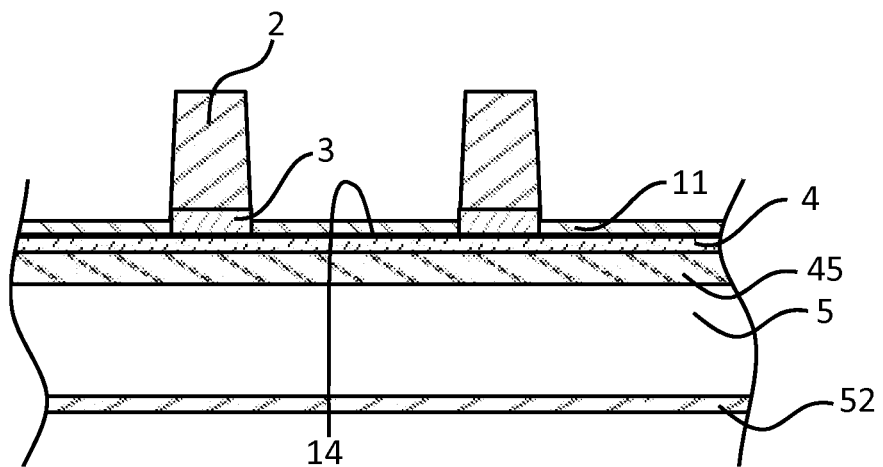
FIGS. 6A-6B are cross-sectional diagrams illustrating perfectly aligned and an imperfectly aligned cells with FSF region protection according to the invention.
Figure 6B:
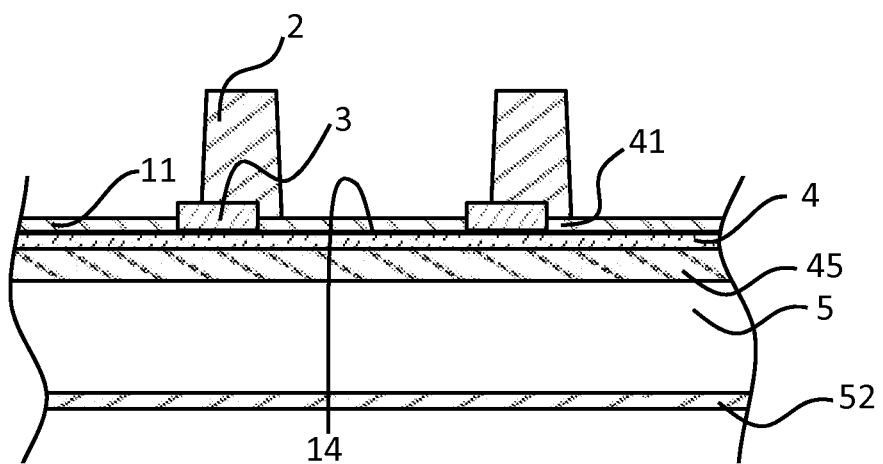

In another embodiment, as shown in FIG. 6A, the width of the cap 3 is chosen to be the same as the width of the metal grid 2. In this embodiment, the shadowing loss is determined by the metal grid width (and misalignment) and the light detection device can be designed to reflect the optimum performance. In case of misalignment, as shown in FIG. 6B, the anti reflection coating 41 will act as an insulating cap and there will be no electrical conduction between the grid line 2 and the window region 4.

Figure 7A:
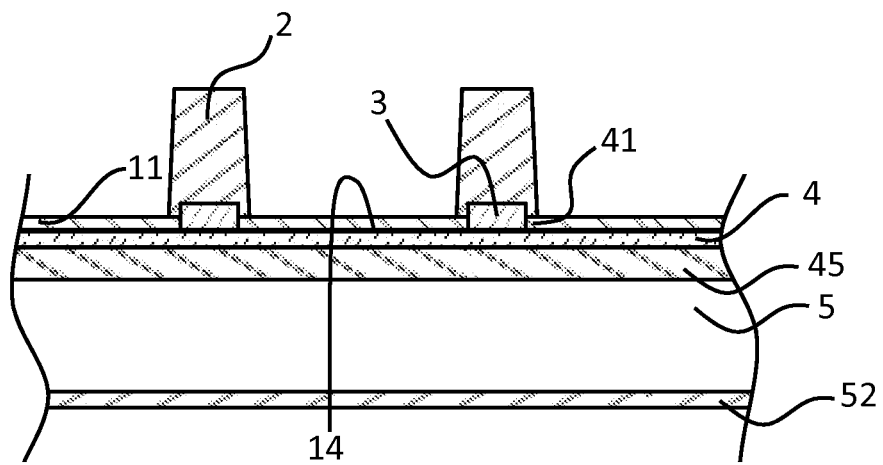
FIGS. 7A-7B are cross-sectional diagrams illustrating oversized metal over a cap in accordance with the invention.
Figure 7B:
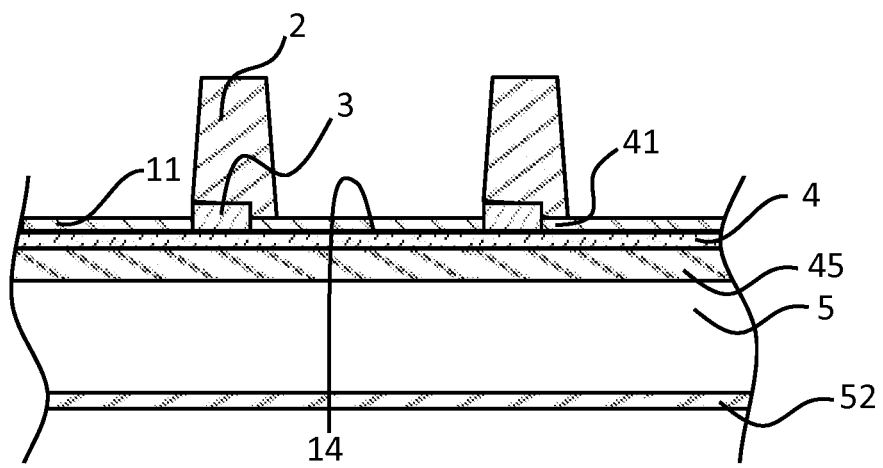

In another embodiment, as shown in FIG. 7A, the width of the cap 3 is chosen to be narrower than the width of the metal grid 2. In this case the anti-reflection coating 41 acts as an insulating barrier between the FSF and the metal. The total shadowing loss is determined by the width of the metal grids. The advantage of this embodiment is that, even in the case of misalignment as shown in FIG. 7B, the shadowing loss will still be determined by the width of the metal grids 2.

Figure 8:
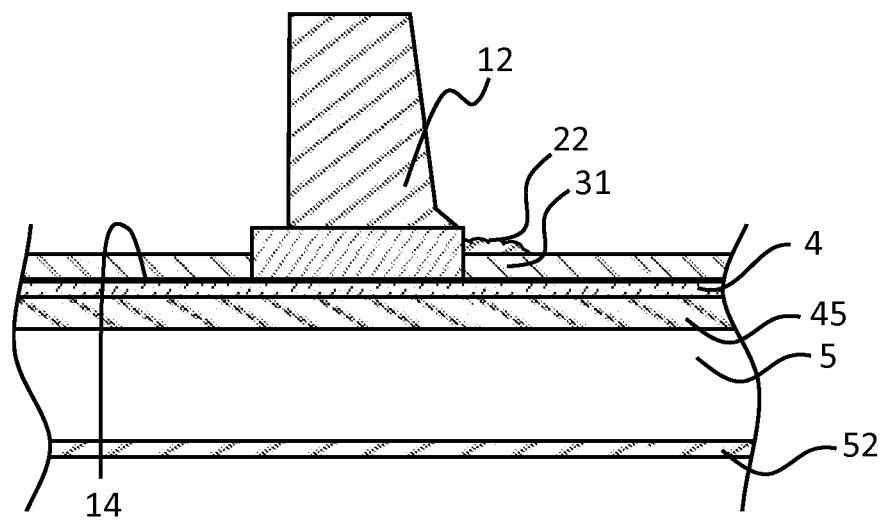
FIG. 8 is a cross-sectional diagram showing an alternative embodiment of a device made according to the invention.

FIG. 8 shows another embodiment in which suboptimal process conditions resulted in stray metal clusters 22 depositing near gridlines 12. The self-aligned anti reflection coating 31 provides electrical insulation and also acts as a physical barrier between these particles and the FSF 4.

It is to be understood that other embodiments may be utilized and structural or logical changes may be made without departing from the scope of the present invention. Therefore the foregoing description is not to be taken in a limiting sense. The scope of the present invention is defined by the appended claims and their equivalents.

What is claimed is:

1. A method for making a semiconductor light detection device comprising the steps of:
    providing a wafer comprising a substrate and a semiconductor light detection device overlying the substrate, wherein the semiconductor light detection device comprises a surface comprising a front surface field region and a cap layer overlying the front surface field region;
    patterning the cap layer with a photoresist in a cap etch pattern using photolithography, wherein the cap etch pattern defines contact areas and window regions between the contact areas;
    etching away the cap layer in the window regions to expose the front surface field region;
    applying an anti-reflection coating over the exposed front surface field region and over the photoresist; and
    removing the photoresist using a liftoff procedure to expose the contact areas.

2. The method of claim 1, wherein each of the steps of claim 1 occur without intervening steps.

3. The method of claim 1, wherein intervening steps occur between the wafer-providing step and the patterning step.

4. The method of claim 1, comprising, after the removing step, applying a metal grid over the contact areas wherein a width of the contact areas is greater than a width of the metal grid.

5. The method of claim 1, comprising, after the removing step, applying a metal grid over the contact areas, wherein a width of the contact areas is less than a width of the metal grid.

6. The method of claim 1, comprising, after the removing step, applying a metal grid over the contact areas wherein a width of the contact areas matches a width of the metal grid.

7. The method of claim 1, wherein removing the photoresist comprises only using a liftoff procedure.

8. The method of claim 1, wherein the anti-reflection coating comprises a stack of dielectric layers.

9. The method of claim 1, comprising, after the removing step, applying a metal grid over the contact areas.

10. The method of claim 1, comprising, after the removing step, applying a metal grid only over the contact areas.

11. The method of claim 1, comprising, after the removing step, applying a metal grid over the contact areas and over a portion of the window regions.

12. A semiconductor light detection device fabricated by the steps of:

provididing a wafer, wherein the wafer comprises:

a substrate and a semiconductor light detection device overlying the substrate, wherein a top region of the semiconductor light detection device comprises a front surface field region and a cap layer overlying the front surface field region;

patterning the cap layer with a photoresist in a cap etch pattern using photolithography, wherein the cap etch pattern defines contact areas and window regions between the contact areas;

etching the cap layer in the window regions according to the cap etch pattern to expose the front surface field region in the window regions;

applying an anti-reflection coating over the exposed front surface field regions and over the photoresist; and removing the photoresist using a liftoff procedure to expose the contact areas, wherein the anti-reflection coating covers the front surface field regions in the window regions.

13. The device of claim 12, comprising, after the removing step, applying a metal grid over the contact areas, wherein a portion of the metal grid is on top of the anti-reflection coating.

\* \* \* \* \*